(12) United States Patent
Bryant (10) Patent No.: US 7,760,041 B2
(45) Date of Patent: Jul. 20, 2010

(54) PULSE-WIDTH MODULATOR METHODS AND APPARATUS

(75) Inventor: Carl Bryant, Höganas (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 72 days.

(21) Appl. No.: 12/127,126

(22) Filed: May 27, 2008

(65) Prior Publication Data

US 2009/0146754 A1     Jun. 11, 2009

Related U.S. Application Data

(60) Provisional application No. 61/012,828, filed on Dec. 11, 2007.

(51) Int. Cl.
H03K 7/08 (2006.01)

(52) U.S. Cl. .................. 332/109; 330/10; 375/238

(58) Field of Classification Search .......... 332/109, 332/110, 111; 330/10; 375/238
See application file for complete search history.

(56) References Cited

U.S. PATENT DOCUMENTS

| | | |
|---|---|---|
| 4,178,557 A | 12/1979 | Henry |
| 4,346,354 A | 8/1982 | Hanna |
| 4,540,957 A | 9/1985 | Hanna |
| 5,838,210 A | 11/1998 | Midya et al. |
| 7,260,368 B1 | 8/2007 | Blumer |
| 2006/0018375 A1* | 1/2006 | Wojtiuk ............. 375/239 |
| 2006/0291589 A1 | 12/2006 | Eliezer et al. |

FOREIGN PATENT DOCUMENTS

| | | |
|---|---|---|
| WO | 2007/060562 A1 | 5/2007 |
| WO | 2008/002225 A1 | 1/2008 |

OTHER PUBLICATIONS

Raab, F., "Radio Frequency Pulsewidth Modulation", IEEE Trans. Comm, pp. 958-966, Aug. 1973.
Zhang, X. et al., "Gain and Phase Error-Free LINC Transmitter", IEEE Transactions on Vehicular Technology, vol. 49, No. 5, Sep. 2000, pp. 1986-1994.
Bryant, Carl, "Pulse-Width Modulation at Radio Frequencies—Master of Science Thesis" University of Twente, Netherlands; Lund University, Sweden, Sep. 24, 2006, pp. cover to 108.
Nielsen, M. et al., "An RF Pulse Width Modulator for Switch-Mode Power Amplification of Varying Envelope Signals", Aalborg University, Silicon Monolithic Integrated Circuits in RF Systems, 2007, Topical Meeting On, pp. 227-280, 2007.
UK Intellectual Property Office, Search and Examination Reports in counterpart Application GB0822488.3, May 29, 2009.

* cited by examiner

Primary Examiner—David Mis
(74) Attorney, Agent, or Firm—Potomac Patent Group PLLC (57) ABSTRACT

Otherwise conventional pulse-width modulators (PWMs) generate signals that can be converted into other forms by reshapers, and thereby overcome many of the problems of conventional PWMs in applications that demand high performance, such as switched-mode amplifiers and radio-frequency transmitters in modern communication systems. With a suitable reshaper, a conventional PWM differential signal can be converted into a signal more typical of linear amplification with nonlinear components (LINC) and still retain low-frequency information, such as the information needed for linearization of a switched-mode amplifier. Apparatus and methods of transforming signals are disclosed.

6 Claims, 8 Drawing Sheets

PULSE-WIDTH MODULATOR METHODS AND APPARATUS

This application is a non-provisional of and claims the benefit of the filing date of U.S. Provisional Patent Application No. 61/012,828 that was filed on Dec. 11, 2007.

BACKGROUND

This invention relates to electronic amplifiers, and more particularly to switched-mode radio frequency (RF) power amplifiers.

Transmitters in many modern communication systems, such as cellular radio systems having carrier frequencies of 1-2 gigahertz (GHz) or so, need to have wide bandwidth, wide dynamic range, and high accuracy (low distortion) in phase and envelope to deal with modern modulation schemes that enable effective use of allocated bandwidth. In addition, it is currently preferable that high-performance amplifiers be implemented in CMOS for reasons of cost and integration. Transmitters in battery-powered devices need to be efficient so that battery energy is conserved.

In conventional radio transmitters, the signal information is often represented as two channels in quadrature phase that can be mixed together to form a combined low-power signal that is amplified for transmission. A linear power amplifier is needed for proper amplification of the combined signal, but there is a trade-off between efficiency and linearity in RF power amplifiers. If high linearity is required, a Class A amplifier can be used, but at the cost of low efficiency. If a constant-envelope signal is to be amplified so that linearity is not critical, a high-efficiency switched-mode (Class D, E, or F) amplifier can be used. Class D amplifiers also can provide high power with low peaks in current and voltage, behavior that is important in CMOS implementations due to the limited breakdown voltages of CMOS devices.

To enable a Class D amplifier to handle signals with non-constant envelopes, the amplifier can use a form of pulse width modulator (PWM) for linearization, such as described in F. Raab, "Radio Frequency Pulsewidth Modulation", *IEEE Trans. Comm.* pp. 958-966 (August 1973); M. Nielsen and T. Larsen, "An RF Pulse Width Modulator for Switch-Mode Power Amplification of Varying Envelope Signals", Silicon Monolithic Integrated Circuits in RF Systems, pp. 277-280, Aalborg University (2007); and International Publication WO 2008/002225 A1 by H. Sjöland, for example.

A radio transmitter combining two or more outputs can use PWM in several different ways, but the basic concept used to pulse-width modulate an RF signal is much the same as for a low-frequency Class D amplifier employing PWM. One difference is that instead of low-pass filtering the output signal to extract information at the same frequency as the input signal to an amplifier, a band-pass filter (BPF) is used in a transmitter to extract information around the PWM switching frequency. This is sometimes called band-pass PWM or BP-PWM.

Figure 1:
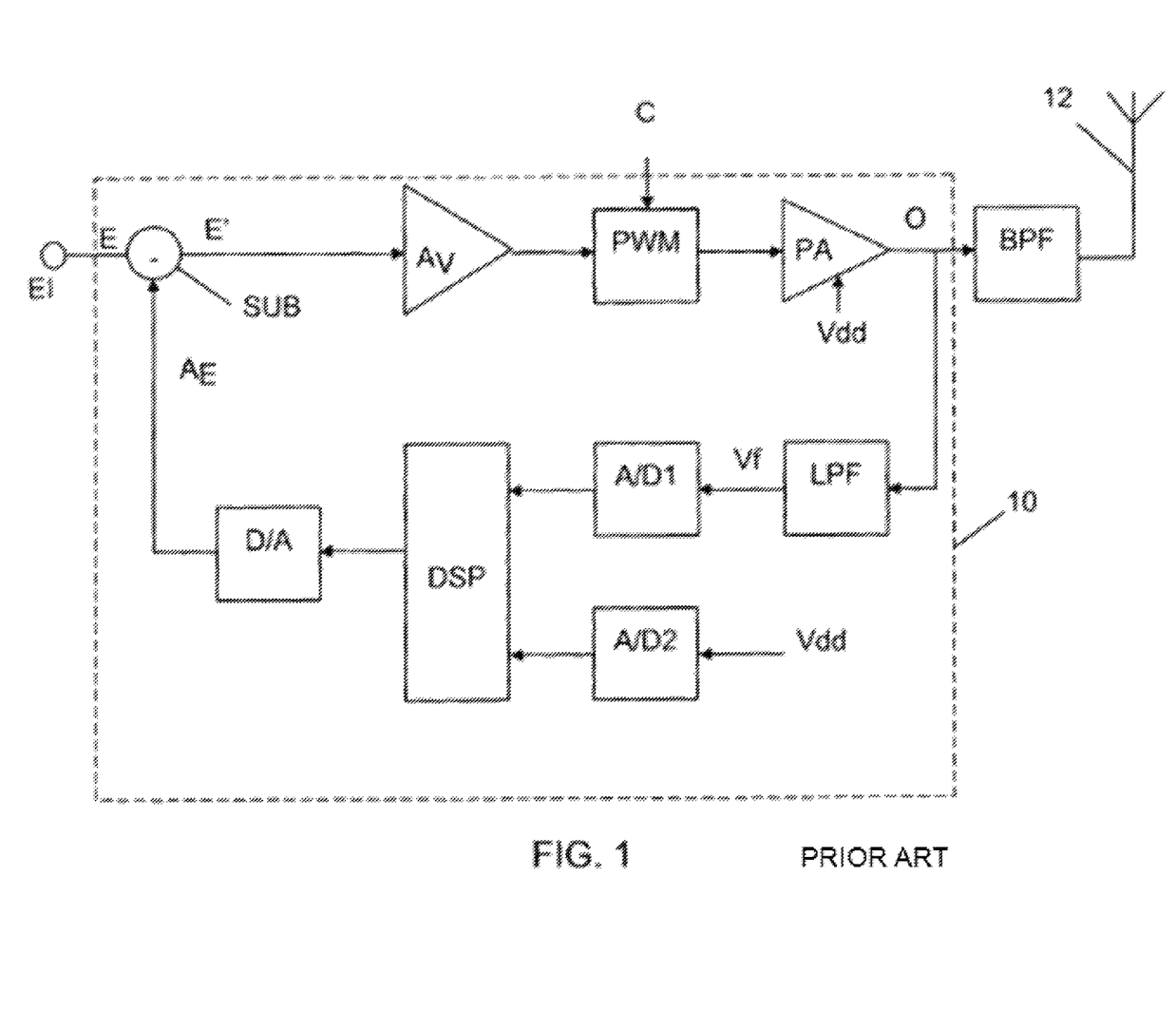
FIG. 1 is a block diagram of a portion of a radio-frequency transmitter.

As described in WO 2008/002225, FIG. 1 is a block diagram of a portion of an RF transmitter that includes a switched-mode power amplifier 10, an output band-pass filter BPF, and an antenna 12. The amplifier 10 receives an input envelope signal input EI that is connected to a first input of an arithmetic subtractor SUB. The output of the subtracting unit SUB is provided to an amplifier Av, whose output is provided to a pulse-width modulator PWM that also receives an RF carrier signal C that is to be provided with phase-information content and transmitted. The output of the modulator PWM is provided to a power amplifier PA that receives a supply voltage Vdd and provides an amplified version of the output of the modulator PWM to the bandpass filter BPF, which is connected to the antenna 12. A second input of the subtractor SUB receives a feedback signal from the output of the power amplifier PA. The feedback signal is produced by a low-pass filter LPF that is connected to the output of the power amplifier PA. The output of the filter LPF is digitized by a first analog-to digital (A/D) converter A/D1 and provided to a digital signal processor DSP. The supply voltage Vdd is digitized by a second A/D converter A/D2 and provided to the processor DSP, which is suitably configured to produce the feedback signal that is converted from digital form to analog form by a D/A converter D/A and provided to the subtractor SUB.

Figure 2:
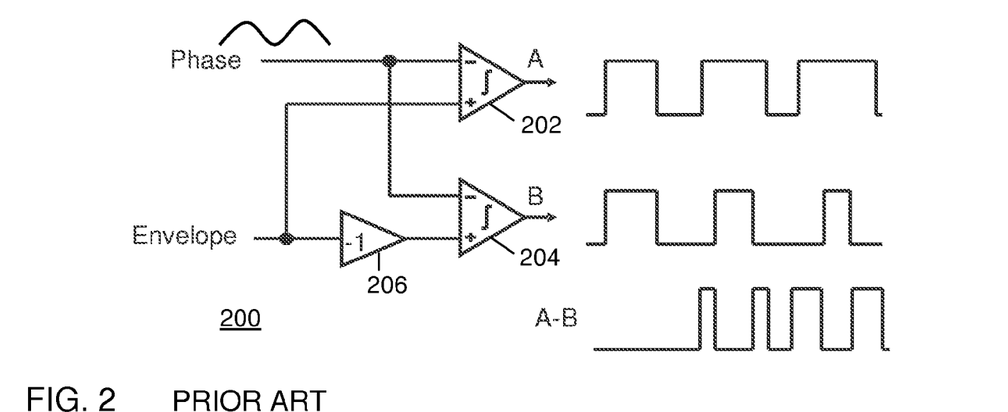
FIG. 2 depicts a known pulse-width modulator.

As noted above, PWMs can be used in many ways with switched-mode amplifiers and signals having non-constant envelopes. FIG. 2 depicts a PWM 200 that can accurately produce two (differential) output signals, with the envelope (amplitude) information able to be used in a feedback loop using low-pass filters, such as shown in FIG. 1 and described in the Nielsen et al. publication cited above. The modulator 200 includes two comparators 202, 204 that produce output signals A, B, respectively, and an inverter 206 connected to the comparator 204. When connected as shown and provided with envelope and phase components of an input signal (i.e., an input signal presented in polar, rather than Cartesian, coordinates), the comparator output signals A, B are trains of pulses that have varying widths, such as those illustrated in FIG. 2. The difference signal A-B is also illustrated in FIG. 2.

Despite its accuracy, a PWM like that depicted in FIG. 2 does not use its output signals A, B efficiently. With a differential output, both positive and negative output voltages can be achieved, but as illustrated in FIG. 2, the difference signal A-B is monopolar. To use a limited voltage supply as efficiently as possible, the full voltage swing should be used (positive and negative) for the output.

A technique that uses two output signals efficiently is linear amplification with nonlinear components (LINC), which is described in the literature, including U.S. Pat. No. 4,178,557 to Henry and U.S. Pat. No. 7,260,368 to Blumer, and X. Zhang and E. Larson, "Gain and Phase Error-Free LINC Transmitter", *IEEE Trans. Vehicular Tech.* Vol. 49, No. 5, pp. 1986-1994 (September 2000). In LINC, two equal signals (using separate power amplifiers) are phase-shifted in relation to each other. When the signals are perfectly in phase, the output signal is zero, and as the relative phase shift increases, the amplitude of the output signal increases until the signals are 180-degrees out of phase. For a Class D amplifier, the signals are two square waves.

Figure 3:
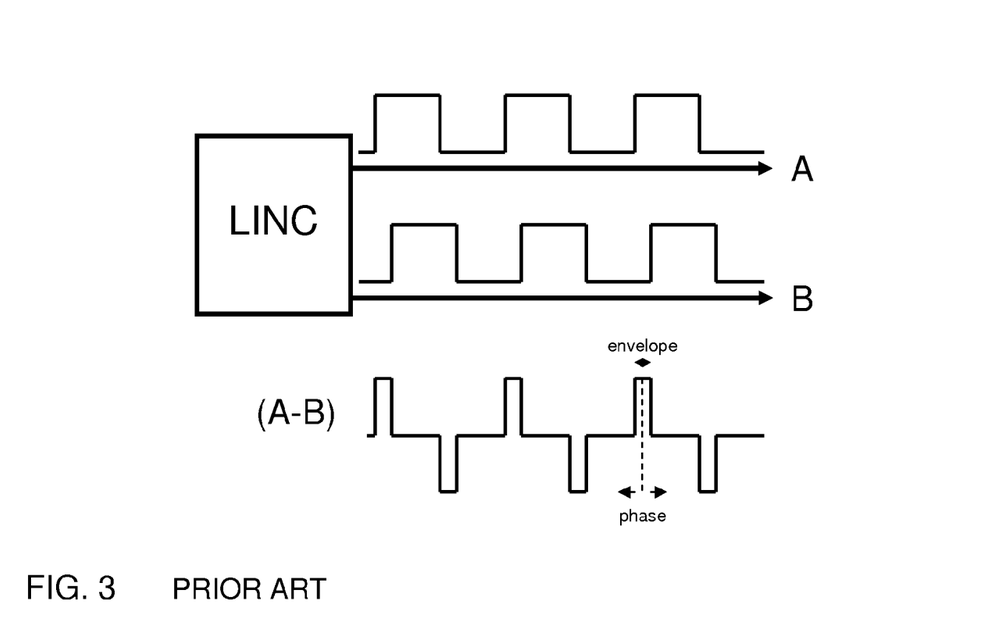
FIG. 3 depicts linear amplification with nonlinear components.

As illustrated by FIG. 3, LINC is not strictly speaking a pulse-width modulation technique because the pulse-widths of the output signals A, B of the LINC arrangement are constant. Nevertheless, the combination (difference) signal A-B can be considered pulse-width modulated in that the widths of the pulses in the difference signal depend on the envelope component of the signal input to the LINC arrangement and the temporal positions of the pulses depend on the phase component of the signal input. A problem with LINC is that there is no low-frequency information in the individual outputs A, B to be used in a feedback loop for linearization. Overcoming that problem is complicated and uses devices that consume substantial power.

SUMMARY

In accordance with aspects of this invention, there is provided a pulse-width modulator that includes a circuit configured to receive an input signal and to generate at least two intermediate output signals, and a reshaper configured to receive the at least two intermediate output signals and, based on the at least two output signals, to produce two final output signals. The input signal includes an envelope component and a phase component, and the at least two intermediate output signals are respective trains of pulses. Each final output signal is a train of pulses, and a difference between the final output signals includes a train of pulses that have amplitudes which can be bipolar, that have widths which correspond to the envelope component of the input signal, and that have temporal positions which correspond to the phase component of the input signal.

In accordance with aspects of this invention, there is provided a method of transforming an input polar-coordinates signal into output pulse-width modulated (PWM) signals. The method includes converting phase- and envelope-components of the input signal into intermediate PWM signals that are respective trains of pulses; and reshaping the intermediate PWM signals into output PWM signals that are trains of pulses such that a difference between the output PWM signals is a train of bipolar pulses that have widths which correspond to the envelope component and temporal positions which correspond to the phase component.

In accordance with aspects of this invention, there is provided a computer-readable medium having stored instructions which, when executed by the computer, cause the computer to perform a method of transforming an input polar-coordinates signals into output PWM signals. The method includes the steps of converting phase- and envelope-components of the input signal into intermediate PWM signals that are respective trains of pulses; and reshaping the intermediate PWM signals into output signals that are trains of pulses such that a difference between the output signals is a train of bipolar pulses that have widths which correspond to the envelope component and temporal positions which correspond to the phase component.

BRIEF DESCRIPTION OF THE DRAWINGS

The several features, objects, and advantages of this invention will be understood by reading this description in conjunction with the drawings, in which.

DETAILED DESCRIPTION

As described in more detail below, the inventor has recognized that various forms of PWM signals can be converted into other forms and thereby overcome the problems of PWMs described above. For example, a conventional PWM differential signal such as that depicted in FIG. 2 can be converted into a LINC-type differential signal such as that depicted in FIG. 3 and still retain low-frequency information, such as the information needed for linearization of a switched-mode amplifier such as that depicted in FIG. 1.

Figure 4A:
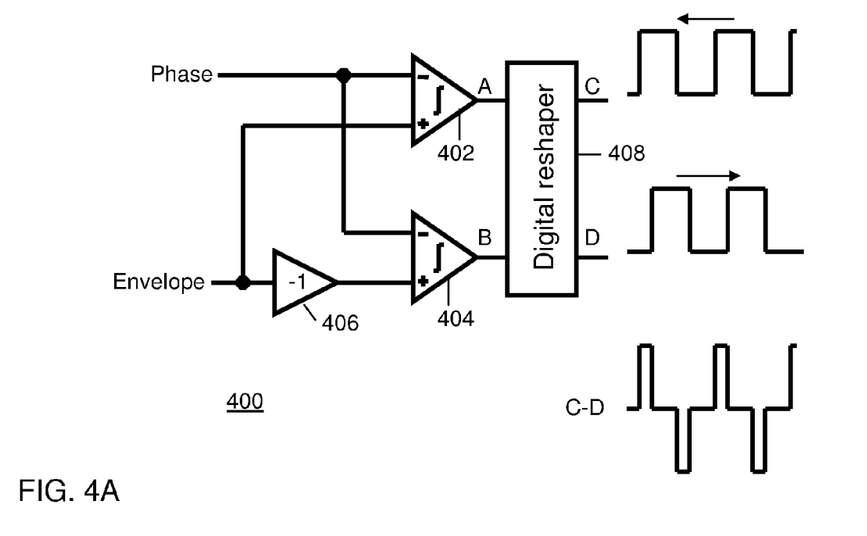
FIGS. 4A, 4B depicts improved pulse-width modulators.

FIG. 4A depicts an embodiment of an improved PWM 400 that includes a conventional network of two comparators 402, 404, and an inverter 406 that receive phase- and envelope-components of an input signal and produce pulse-train intermediate output signals A, B as described above in connection with FIG. 2. The PWM 400 also includes a digital reshaper 408 that receives the intermediate signals A, B and based on those signals generates output signals C, D that are substantially identical to the LINC output signals described above in connection with FIG. 3. In other words, the reshaper 408 produces two final output signals that are trains of pulses, with the differential final output signal having bipolar pulses that have widths which correspond to the envelope component of the input signal and temporal positions which correspond to the phase component of the input signal. The reshaper 408 is described in more detail below.

Figures 5A, 5B:
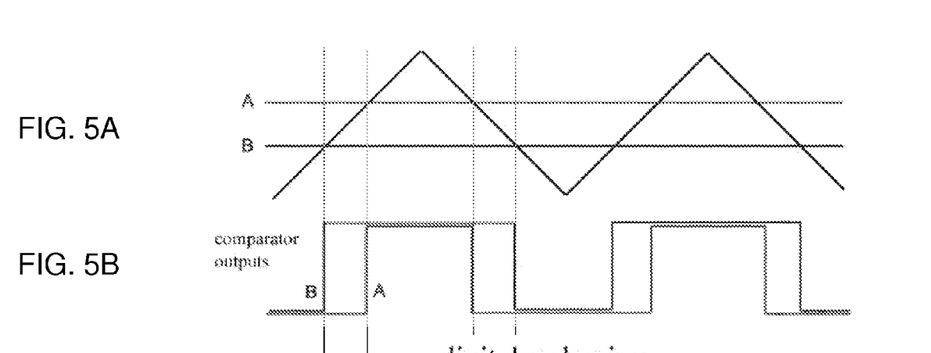
FIG. 5 depicts the operation of an improved pulse-width modulator.
Figure 5C:
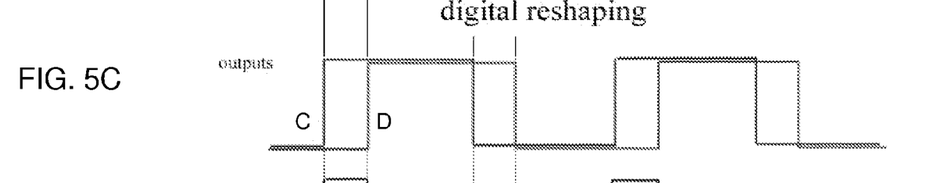
Figure 5D:
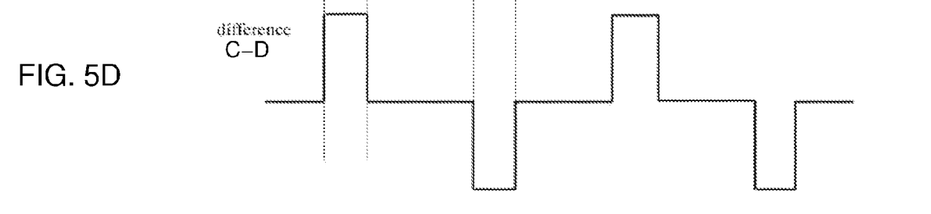

The operation of the improved PWM 400 is illustrated by FIG. 5 for the case in which the input phase component provided to the comparator 402 is a triangle wave. FIG. 5A shows the triangle-wave phase component and horizontal lines labeled A, B, which represent the envelope component provided to the comparators 402, 404, respectively. As the envelope increases, the lines A, B move apart, and thus the pulses from one of the comparators get wider and the pulses from the other comparator get narrower. FIG. 5B shows the comparator output pulse trains A, B that are provided to the reshaper 408, which converts the intermediate output pulse trains A, B into the final output pulse trains C, D depicted in FIG. 5C. As can be seen, the edges of the intermediate output signals A, B input to the reshaper determine the edges of the final output signals C, D from the reshaper. The difference signal C-D is depicted in FIG. 5D. In FIG. 5, time is on the horizontal axis and signal amplitude, or voltage, is on the vertical axis.

It will be understood that in general the phase component (e.g., that shown in FIG. 5A) is not limited to triangle waves. For the case where there exists no feedback, the optimum wave shape would be sinusoidal due to the sinusoidal relationship between pulse width and envelope (see the above-cited publication by F. Raab). The use of a non-triangular phase signal can be compensated with predistortion. Where a low-frequency feedback loop exists, the optimum phase-component shape is triangular as depicted in FIG. 5A because the fed-back low-frequency information has a linear relation to the pulse width. Nevertheless, the feedback loop will suppress distortion caused by a non-triangular phase component. For large enough signals, even a system with low-frequency feedback may need predistortion (e.g., an inverse sine) to compensate for the relationship of pulse width and envelope.

The artisan will understand that other embodiments of the PWM 400 can be built with different forms of pulse-width modulation at the inputs of the reshaper 408 and different forms of the reshaper output signals C, D. For example, the intermediate output signals A, B that are input to the reshaper 408 can be LINC-like output signals as depicted in FIG. 3 and the output signals C, D generated by the reshaper can be conventional PWM output signals as depicted by FIG. 2. Such an arrangement can be used as a phase detector, which is useful in receivers and other devices, if it includes a low-pass filter for the PWM output signals. In such an arrangement, the low-pass filtered difference signal indicates the phase difference.

Figure 6A:
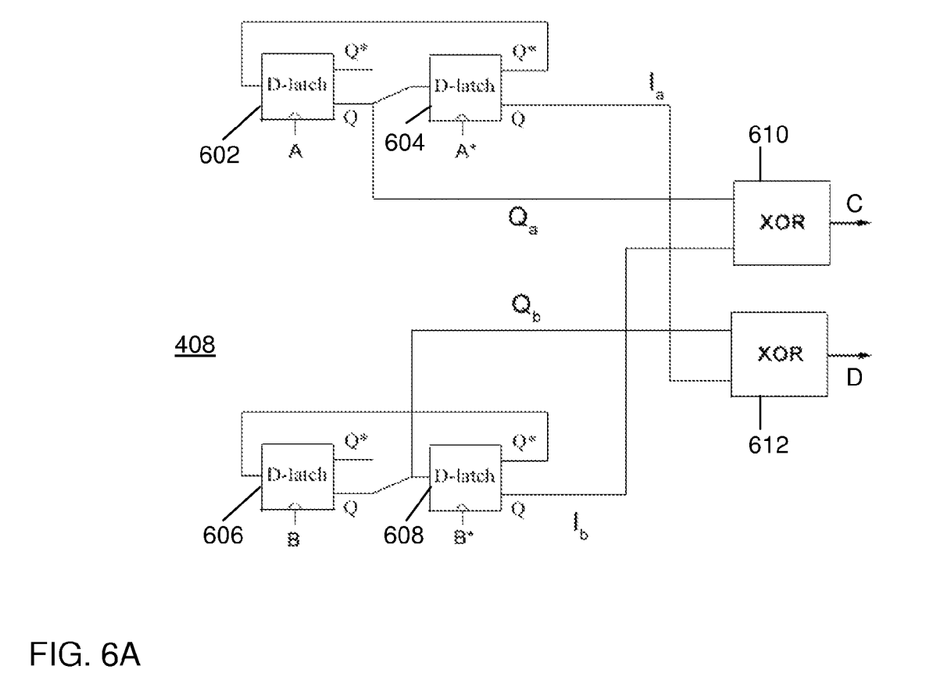
FIGS. 6A, 6B, 6C are diagrams of reshapers for improved pulse-width modulators.

FIG. 6A is a diagram of an embodiment of the reshaper 408. Intermediate output signals A, B and their inverses A*, B* are provided to the clock inputs of respective pairs of D-latches 602, 604 and 606, 608. The Q output of the D-latch 602 is provided to the input of the D-latch 604, whose inverse output Q* is provided to the input of the D-latch 602, and the pair of D-latches 606, 608 is connected in like manner. Exclusive-OR (XOR) gates 610, 612 produce the output signals C, D based on second intermediate output signals $I_b$, $Q_a$ of the latches 608, 602, respectively, and $I_a$, $Q_b$ of the latches 604, 606, respectively.

The D-latches that generate the second intermediate output signals are used as memory elements to determine if the edges of the intermediate output signals are rising or falling. The artisan will understand that D-latches are not necessary and that other devices, including for example a suitably programmed digital signal processor and arrangements of logic gates, can be used. Indeed, all of the reshapers and arrangements described in this application can be regarded as hardwired or programmed signal processors.

Figure 7A:
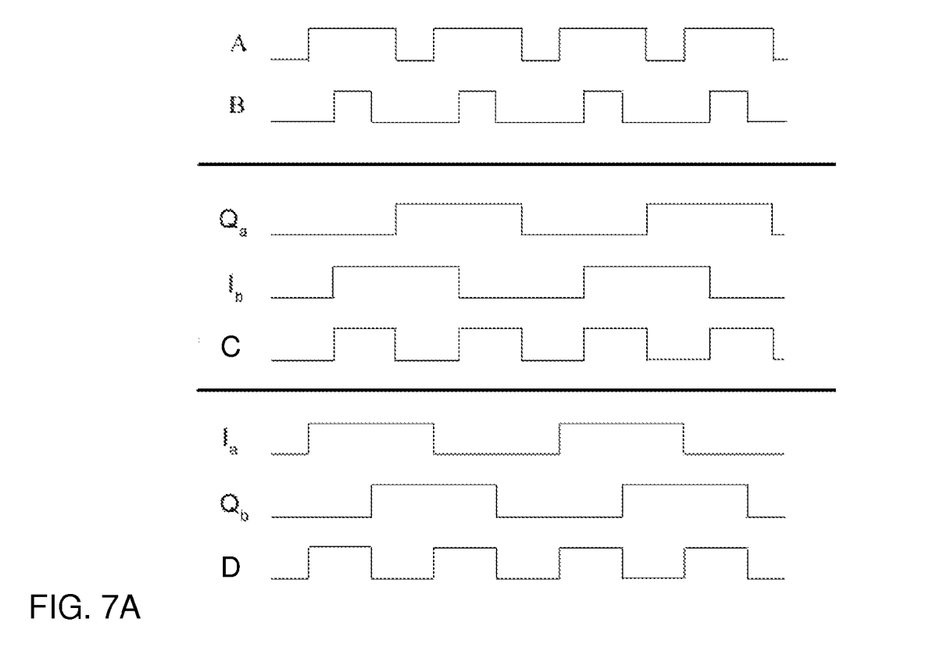
FIGS. 7A, 7B depict exemplary waveforms for the improved pulse-width modulators.

FIG. 7A shows exemplary waveforms for the intermediate signals A, B, the second intermediate signals $I_a$, $I_b$, $Q_a$, $Q_b$, and the output signals C, D in the reshaper 408 depicted in FIG. 6A. It will be observed that each pair of D-latches 602, 604 and 606, 608 separates a respective intermediate output signal A, B into two respective components $I_a$, $Q_a$, and $I_b$, $Q_b$ of the second intermediate output signals that have half the frequency of the intermediate signal and different phase.

In the PWM 400, a large envelope can produce pulses in the intermediate output signals A, B that may be so narrow or distorted that the reshaper 408 cannot handle the signals A, B properly. This can be avoided by a PWM 400' that employs somewhat more complicated signals but that operates in substantially the same way as the PWM 400.

Figure 4B:
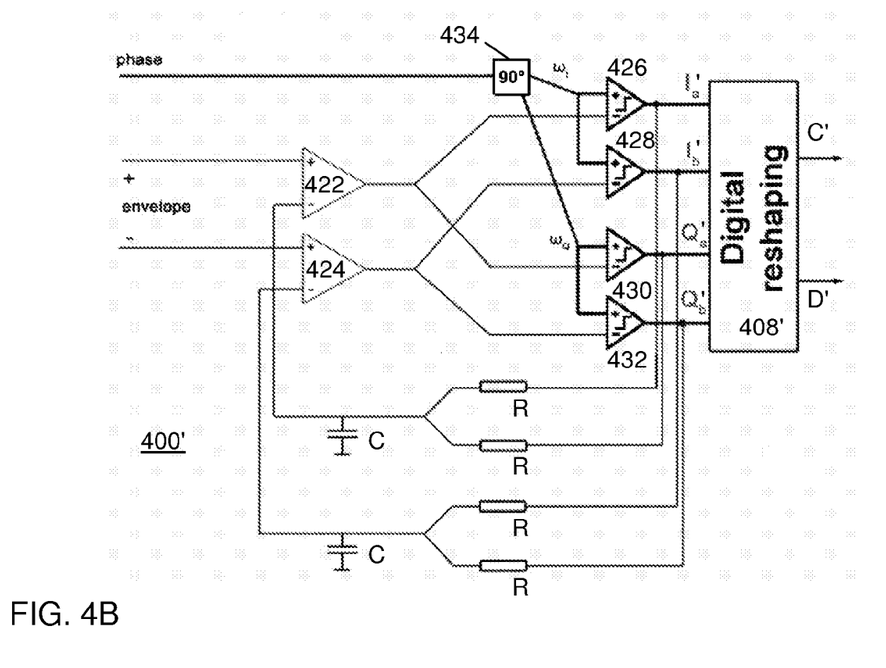

FIG. 4B depicts such a PWM 400' that includes a pair of amplifiers 422, 424, a network of four comparators 426-432, and a ninety-degree phase shifter 434 that receive phase- and envelope-components of an input signal and convert the input signal components directly into respective pairs of second intermediate output signal components $I_a'$, $Q_a'$ and $I_b'$, $Q_b'$. It will be noted that the signals $I_a'$, $I_b'$, $Q_a'$, $Q_b'$ are called "second" intermediate output signals merely because of their similarity to the second intermediate output signals discussed in connection with FIG. 6A. The inclusion of the phase shifter 434 enables the pair of comparators 426, 428 and the pair of comparators 430, 432 to be viewed as two conventional pulse-width modulators, like the PWM depicted in FIG. 1, that operate at different phases. The PWM 400' also includes a digital reshaper 408' that receives the second intermediate output signals $I_a'$, $Q_a'$ and $I_b'$, $Q_b'$ and based on those signals generates output signals C', D' that resemble the LINC output signals described above in connection with FIG. 3.

As depicted in FIG. 4B, the PWM 400' also includes resistors R and capacitors C that are connected as low-pass filters and, together with the amplifiers 422, 424, provide a local feedback path around the "conventional" pulse-width modulators (i.e., the comparator pairs 426, 428 and 430, 432). Despite its additional circuit complexity, such a feedback path is one of the benefits of using a PWM such as that depicted in FIG. 4B in comparison to that depicted in FIG. 4A. It will be appreciated that a local feedback path can also be put around the modulator of FIG. 4A, although the possibility of too-short pulses would remain.

The gains of the amplifiers 422, 424, which control the amount of feedback, are mainly limited by stability considerations as in any other negative-feedback system. The problem of too-short pulses is solved by how the circuit is constructed, with all input signals at half the output frequency as noted below. The feedback can be adjusted to vary the overall gain from input to output, but the pulse widths associated with each output level will be unchanged.

Figure 6B:
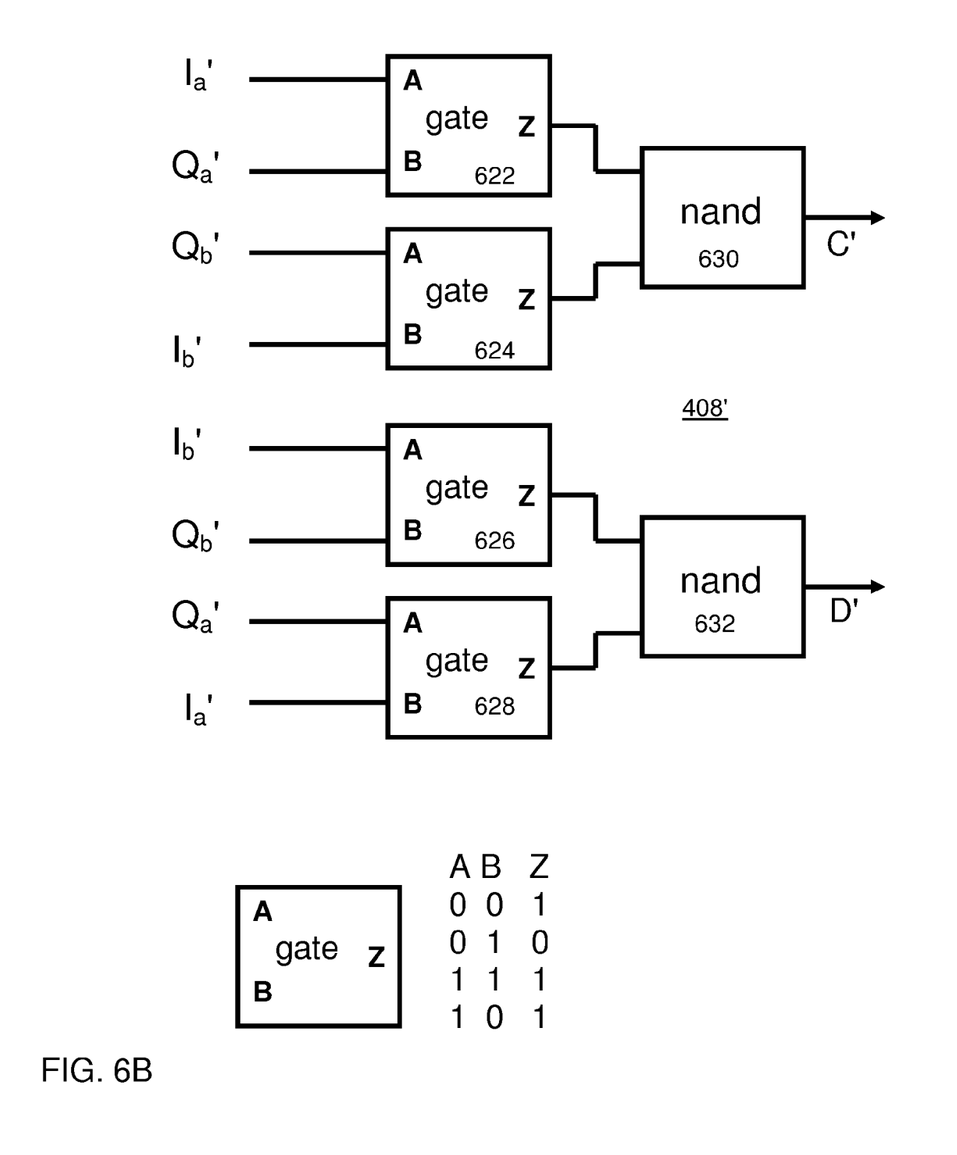

As explained below, it is not necessary to separate rising and falling signal edges in the PWM 400', and memory or feedback is not required in the reshaper 408'. This simplifies the reshaper 408', which can be implemented by a fairly simple set of logic gates as illustrated by FIG. 6B. Two pairs of two gates 622, 624 and 626, 628 receive the second intermediate output signals $I_a'$, $Q_a'$, $I_b'$, $Q_b'$ that are input to the reshaper 408', with the gates in each pair receiving respective pairs of components $I_a'$, $Q_a'$ and $I_b'$, $Q_b'$. The outputs of each pair of gates 622, 624 and 626, 628 are provided to respective NAND gates 630, 632 that produce the output signals C', D' generated by the reshaper 408'. The truth table for each gate 622-628 is depicted in FIG. 6B. The gates 622-628 can be implemented conveniently as suitably connected collections of conventional digital logic gates or suitably programmed gate arrays and processors.

Figure 7B:
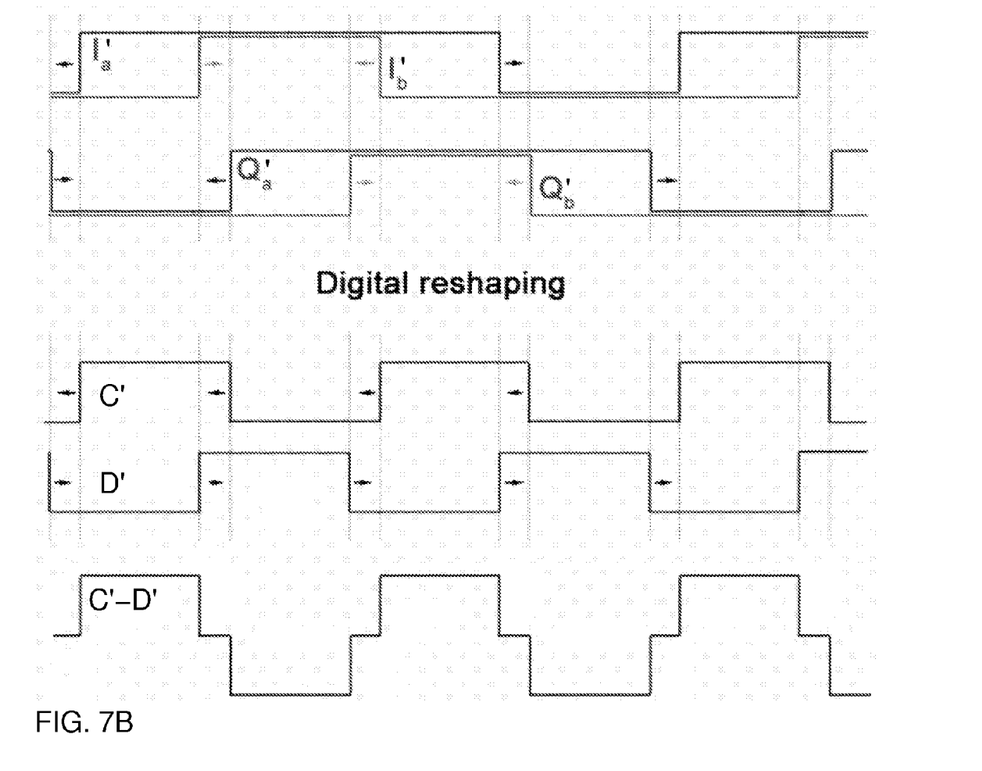

FIG. 7B depicts exemplary waveforms for the second intermediate output signals $I_a'$, $Q_a'$, $I_b'$, $Q_b'$, and the output signals C', D' of the PWM 400'. As explained above, two sets of pulse-width modulated signals $I_a'$, $I_b'$ and $Q_a'$, $Q_b'$ are provided as inputs to the reshaper 408'. They are the same except for a ninety-degree phase shift. In this case, the inputs operate at half the frequency of the outputs C', D', and as a result, the pulse-widths of the input signals have to vary less to obtain a certain change in the output duty cycle than they do in the arrangement depicted in FIG. 4A. In FIG. 7B, it should be noted that the duty cycle is nearly 50%. For a 0-100% range of an input envelope component, the duty cycles of $I_a'$, $Q_a'$ and $I_b'$, $Q_b'$, have to vary between 50%-75% and 50%-25%, respectively, for the PWM 400' and between 50%-100% and 50%-0%, respectively, for the PWM 400. Thus, the pulse widths in the PWM 400' do not become so small/large that the reshaper 408' has trouble.

The PWMs described above can be used in many ways, for example to linearize the performance of a switched-mode amplifier or a radio transmitter. Although the transmitter depicted in FIG. 1, for example, is linearized with a feedback path, the linearization will not work if the output does not contain suitable low-frequency information. As noted above, LINC signals do not contain suitable low-frequency information, while the "ordinary" PWM signals input to the reshapers 408, 408' do. The feedback is extracted before the reshaper and thus before the low-frequency information is lost. (The operation is effectively reversed in the above-described arrangements of a phase detector, and so low-frequency information is effectively recreated.) In addition, an arrangement such as that depicted in FIG. 1 may see too-short pulses and resultant instability, depending on the implementation of the circuit. It will also be appreciated that the carrier C shown in FIG. 1 would be related to the phase-component signals in the PWMs 400, 400', and a carrier signal provided to the PWMs 400, 400' would typically not be a square wave, as it might be in FIG. 1.

The artisan will understand that a switched-mode RF amplifier need not be limited to amplifying the fundamental frequency but a higher harmonic can be extracted to offer a higher output frequency compared to the operating (fundamental) frequency. In other words, the amplifier's output frequency can be higher than its switching frequency. In practice, the lower amplitudes of the higher harmonics compared to the fundamental can be a limiting factor, but such a switched-mode amplifier would then simply have lower gain that can be useful for low-power operating modes. The artisan will also understand that PWMs in accordance with this invention can be used in many other devices.

Generating the phase-shifted signals of a LINC amplifier conventionally requires quadrature modulators that result in sensitivity to phase- and gain-mismatches and limited accuracy without some form of additional linearization. Linearizing such an amplifier can involve demodulating the output signal or detecting the envelope, either of which requires circuitry that is relatively complex and consumes relatively high power. These problems with conventional approaches render them inadequate for many applications having stringent performance requirements.

The inventor has recognized that a reshaper such as those described above can use pulse-width-modulated signals like those depicted in FIG. 2 as a reference, and doing so enables a local feedback path for the envelope to be made easily using low-pass filters. Feedback of this kind is simple and efficient.

Figure 8:
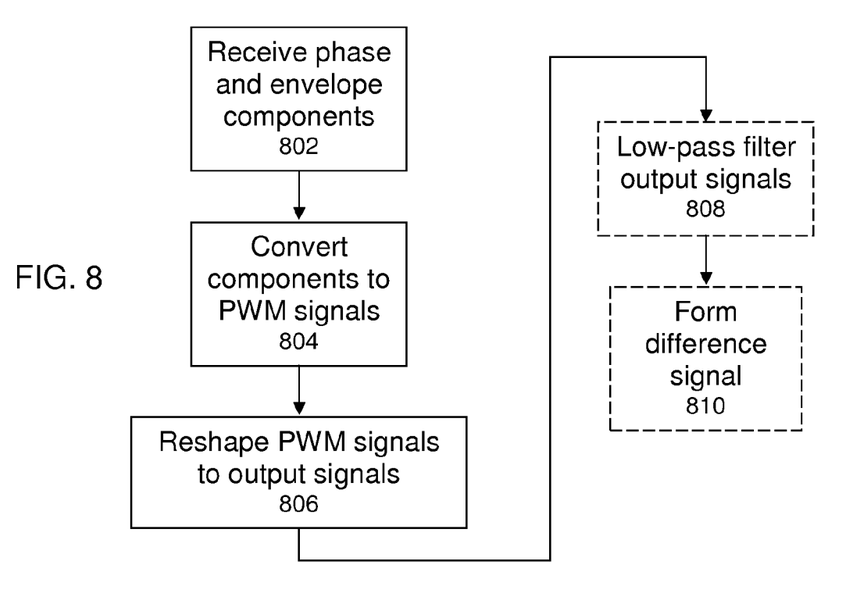
FIG. 8 is a flowchart of a method of transforming input polar-coordinates signals into output pulse-width-modulated signals.

FIG. 8 is a flowchart of a method of transforming input polar-coordinates signals into output PWM signals. In step 802, phase- and envelope-components of an input signal are received, and in step 804, those component signals are converted into intermediate pulse-train (PWM) output signals. Such intermediate PWM signals can be the intermediate output signals and/or the second intermediate output signals discussed above in connection with FIGS. 4A and 6A, or simply the second intermediate output signals discussed above in connection with FIGS. 4B and 6B. In step 806, the intermediate PWM signals are reshaped into output PWM signals that are trains of pulses, with the differential final output signal having bipolar pulses that have widths which correspond to the envelope component of the input signal and temporal positions which correspond to the phase component of the input signal. The output PWM signals are substantially identical to LINC-type output signals described above in connection with FIG. 3.

As described above in connection with FIG. 4B for example, the frequencies of the intermediate PWM signals can be half the frequencies of the output signals and a phase signal carrier of the same frequency as the intermediate PWM signals if they are suitably generated. The artisan will understand that the input envelope component is at baseband and so is not typically considered to have an "operating frequency". The reshaper 408 of FIG. 4A has internal signals that are half the frequency of the input and output signals of the reshaper. The converting step 804 can include adding a fed-back portion of the intermediate PWM signals to the component signals to be converted. The reshaping step 806 can involve determining if edges of the intermediate PWM signals are rising or falling. The steps 802, 804, 806 can be performed by one or more suitably programmed electronic processors or suitably connected collections of logic gates.

It will be understood that the method depicted in FIG. 8 can be augmented in many ways. For example, if the intermediate PWM signals are LINC-like signals, then the optional low-pass filtering the output signals (step 808) and forming a difference between the low-pass filtered output signals (step 810) results in a method of transforming input polar-coordinates signals into a phase difference signal. It will be appreciated with respect to step 808, which depicts low-pass filtering the signals before forming a difference signal (step 810), that when producing an RF output signal, the output signal can be band-pass filtered (with a balun placed before or after such a band-pass filter) before the load, e.g., an antenna.

Figure 9:
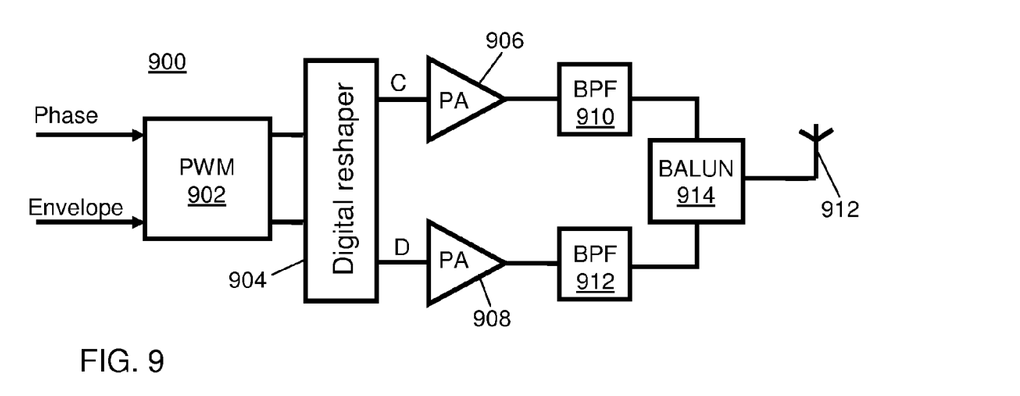
FIG. 9 is a block diagram of a portion of an improved amplifier and radio-frequency transmitter.

FIG. 9 is a block diagram of a portion of an improved transmitter 900 showing improved switched-mode amplifiers. Phase and envelope components of a signal to be amplified or transmitted are provided to a PWM 902, which can be implemented as depicted in FIG. 4 for example. The PWM 902 generates PWM signals that are provided to a digital reshaper 904, which can be implemented as depicted in FIG. 6 for example. The output signals C, D generated by the reshaper 904 are provided to respective switched-mode amplifiers 906, 908, and the amplified signals generated by the amplifiers are spectrally shaped by respective bandpass filters 910, 912. The filtered signals produced by the filters 910, 912 are combined by a balun 914, which also impedance-matches the filters 910, 912 to an antenna 912.

Figure 6C:
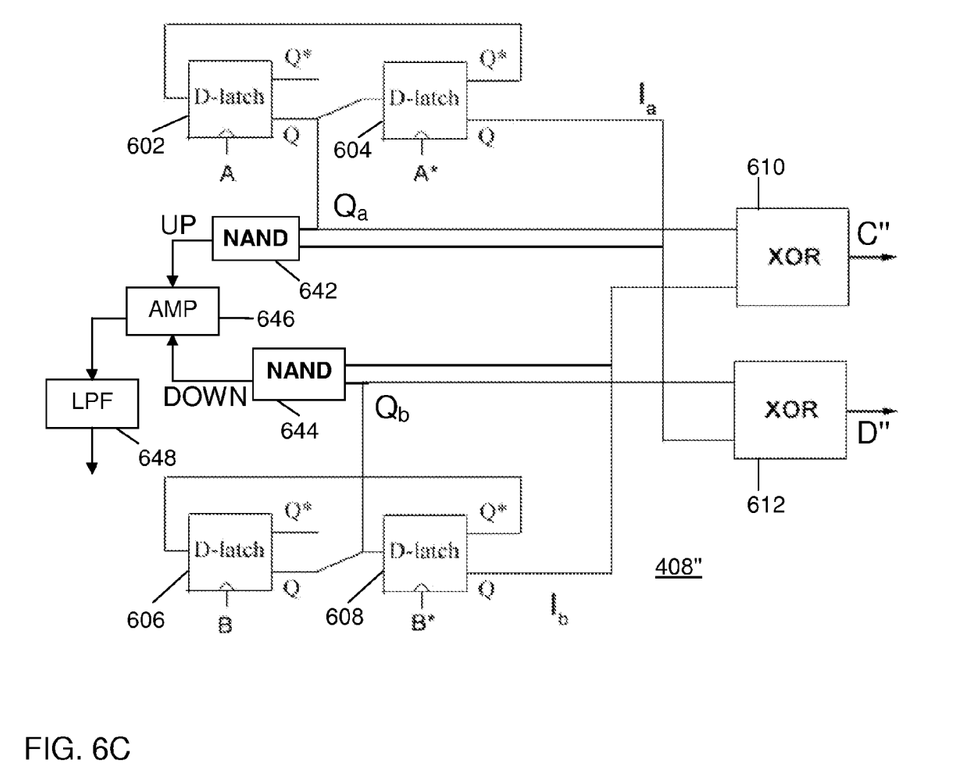

It will be recalled that with "ordinary" PWM signals input to a reshaper, such as the reshapers 408, 408', low-pass filtering to provide a feedback signal is performed on the signals input to the reshaper. It is possible to configure the reshaper such that it provides suitable feedback signals having low-frequency information that are recreated from the half-frequency signals in the reshaper. Such a reshaper 408" is depicted in FIG. 6C, which is substantially the same as FIG. 6A but for two otherwise conventional logical NAND gates 642, 644 that are connected such that one of the gates 642, 644 has the second intermediate output signals $Q_a$, $I_a$ as inputs and the other of the gates has the second intermediate output signals $Q_b$, $I_b$ as inputs. In effect, the reshaper 408" uses the NAND gates 642, 644 produce a signal that is representative of the phase of the internal half-frequency second intermediate output signals $Q_a$, $Q_b$, $I_a$, $I_b$, which are in quadrature. That NAND gate phase detector avoids the problem of short pulses by generating output signals on both the UP and DOWN terminals of the gates 642, 644 for zero phase difference. The UP and DOWN output signals can be connected to an amplifier 646, such as a charge pump as in a typical phase detector, or another suitable amplifier, and the amplified signal can then be shaped by a low-pass filter 648. Thus, the output signal produced by the low-pass filter 648 is a suitable feedback signal that is based on the phase of the second intermediate output signals.

It will be appreciated that procedures described above are carried out repetitively as necessary, for example, to respond to the time-varying nature of communication channels between transmitters and receivers.

To facilitate understanding, many aspects of this invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both. Wireless transceivers implementing embodiments of this invention can be included in, for example, mobile telephones, pagers, headsets, laptop computers and other mobile terminals, base stations, and the like.

Moreover, this invention can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, communicate, propagate, or transport the program for use by or in connection with the instruction-execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium include an electrical connection having one or more wires, a portable computer diskette, a random-access memory (RAM), a read-only memory (ROM), an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A pulse-width modulator, comprising:
    a circuit configured to receive an input signal and to generate at least two intermediate output signals, wherein the input signal includes an envelope component and a phase component, and the at least two intermediate output signals are respective trains of pulses, and the circuit comprises a network of two comparators and an inverter, and rising and falling edges of pulses in the intermediate output signals determine temporal positions of edges of pulses in the final output signals; and
    a reshaper configured to receive the at least two intermediate output signals and, based on the at least two output signals, to produce two final output signals, wherein each final output signal is a train of pulses, and a difference between the final output signals includes a train of pulses that have amplitudes which can be bipolar, that have widths which correspond to the envelope component of the input signal, and that have temporal positions which correspond to the phase component of the input signal, and the reshaper comprises at least two pairs of latches and at least two exclusive-OR gates, the pairs of latches are configured to convert the intermediate output signals and their inverses into second intermediate output signals that are provided to the exclusive-OR gates, and based on the second intermediate output signals, the exclusive-OR gates generate the final output signals; and
    a network that generates a feed-back signal based on the second intermediate output signals, wherein the network includes at least two logical NAND gates that generate a signal representative of a phase of the second intermediate output signals, and the feed-back signal is based on the phase-representative signal.

2. The modulator of claim 1, wherein the latches are D-latches and the intermediate output signals and their inverses are provided to clock inputs of the D-latches.

3. A pulse-width modulator, comprising:
    a circuit configured to receive an input signal and to generate at least two intermediate output signals, wherein the input signal includes an envelope component and a phase component, and the at least two intermediate output signals are respective trains of pulses; and
    a reshaper configured to receive the at least two intermediate output signals and, based on the at least two output signals, to produce two final output signals, wherein each final output signal is a train of pulses; a difference between the final output signals includes a train of pulses that have amplitudes which can be bipolar, that have widths which correspond to the envelope component of the input signal, and that have temporal positions which correspond to the phase component of the input signal; and the reshaper includes two pairs of logic gates and a NAND gate for each pair that produce the final output signals based on signals from the pairs of logic gates;
    wherein the circuit comprises a network of four comparators and a phase shifter, wherein the network receives the phase and envelope components of the input signal and converts the components into respective pairs of intermediate output signal components.

4. The modulator of claim 3, further comprising a feedback network that includes low-pass filters configured to produce portions of the intermediate output signal components to be fed back to the circuit.

5. The modulator of claim 1, wherein the modulator is included in a switched-mode amplifier.

6. The modulator of claim 1, wherein the modulator is included in a radio-frequency transmitter.

* * * * *